(12) United States Patent
Blonder et al.

(10) Patent No.: US 7,157,745 B2
(45) Date of Patent: Jan. 2, 2007

(54) ILLUMINATION DEVICES COMPRISING WHITE LIGHT EMITTING DIODES AND DIODE ARRAYS AND METHOD AND APPARATUS FOR MAKING THEM

(76) Inventors: Greg E. Blonder, 120 Woodland Ave., Summit, NJ (US) 07901; Edmar M. Amaya, 251 W. Delkalb Pike, King of Prussia, PA (US) 19406

( * ) Notice: Subject to any disclaimer, the term of this patent is extended or adjusted under 35 U.S.C. 154(b) by 88 days.

(21) Appl. No.: 10/822,236

(22) Filed: Apr. 9, 2004

(65) Prior Publication Data

US 2005/0224830 A1    Oct. 13, 2005

(51) Int. Cl.
*H01L 29/22* (2006.01)

(52) U.S. Cl. .................... 257/98; 257/100; 438/26

(58) Field of Classification Search ............... 257/88, 257/98, 100; 438/26, 27, 29; 427/474, 475

See application file for complete search history.

(56) References Cited

U.S. PATENT DOCUMENTS

| | | | | |
|---|---|---|---|---|
| 4,902,567 | A | * | 2/1990 | Eilertsen et al. ............ 428/328 |
| 5,441,774 | A | * | 8/1995 | Dutta et al. ................. 427/476 |
| 5,674,554 | A | * | 10/1997 | Liu et al. ..................... 427/71 |
| 5,847,507 | A | | 12/1998 | Butterworth et al. |
| 5,908,155 | A | | 6/1999 | Duffy et al. |
| 5,959,316 | A | | 9/1999 | Lowery |
| 5,998,925 | A | | 12/1999 | Shimizu et al. |
| 6,066,861 | A | | 5/2000 | Hohn et al. |
| 6,069,440 | A | | 5/2000 | Shimizu et al. |
| 6,245,259 | B1 | | 6/2001 | Hohn et al. |
| 6,277,301 | B1 | | 8/2001 | Hohn et al. |
| 6,417,019 | B1 | | 7/2002 | Mueller et al. |
| 6,455,930 | B1 | | 9/2002 | Palanisamy et al. |
| 6,478,402 | B1 | | 11/2002 | Greive |
| 6,576,488 | B1 | | 6/2003 | Collins, III et al. |
| 6,576,930 | B1 | | 6/2003 | Reeh et al. |
| 6,577,073 | B1 | | 6/2003 | Shimizu et al. |
| 6,592,780 | B1 | | 7/2003 | Hohn et al. |
| 6,608,332 | B1 | | 8/2003 | Shimizu et al. |
| 6,613,247 | B1 | | 9/2003 | Hohn et al. |
| 6,614,179 | B1 | | 9/2003 | Shimizu et al. |
| 6,622,948 | B1 | | 9/2003 | Haas et al. |
| 6,627,115 | B1 | | 9/2003 | Hampden-Smith et al. |
| 6,630,691 | B1 | | 10/2003 | Mueller-Mach et al. |
| 6,670,751 | B1 | | 12/2003 | Song et al. |
| 6,682,207 | B1 | | 1/2004 | Weber et al. |

(Continued)

FOREIGN PATENT DOCUMENTS

DE    19625622 A1    1/1998

(Continued)

*Primary Examiner*—Sara Crane
(74) *Attorney, Agent, or Firm*—Lowenstein Sandler PC

(57) ABSTRACT

In accordance with the invention, an illumination device comprises a substrate having a surface and a cavity in the surface. At least one light emitting diode ("LED") is mounted within the cavity, and a monolayer comprising phosphor particles overlies the LED. The phosphor monolayer is adhered to the LED by a monolayer of transparent adhesive material. An optional optical thick layer of transparent material overlies the phosphor monolayer to encapsulate the LED and optionally to form a lens. Methods and apparatus for efficiently making the devices are disclosed.

28 Claims, 4 Drawing Sheets

U.S. PATENT DOCUMENTS

| | | |
|---|---|---|
| 6,734,465 B1 * | 5/2004 | Taskar et al. .................. 257/80 |
| 6,747,293 B1 | 6/2004 | Nitta et al. |
| 6,831,302 B1 | 12/2004 | Erchak et al. |
| 6,833,669 B1 * | 12/2004 | George et al. .............. 313/506 |
| 2001/0000622 A1 | 5/2001 | Reeh et al. |
| 2001/0001207 A1 | 5/2001 | Shimizu et al. |
| 2001/0030326 A1 | 10/2001 | Reeh et al. |
| 2001/0045647 A1 | 11/2001 | Hohn et al. |
| 2002/0195931 A1 * | 12/2002 | George et al. .............. 313/506 |
| 2003/0077385 A1 | 4/2003 | Ainsworth et al. |
| 2004/0051111 A1 | 3/2004 | Ota et al. |
| 2004/0084687 A1 | 5/2004 | Hohn et al. |
| 2004/0203189 A1 | 10/2004 | Chen et al. |
| 2006/0106484 A1 | 5/2006 | Bash et al. |

FOREIGN PATENT DOCUMENTS

| | | |
|---|---|---|
| DE | 19638667 A1 | 4/1998 |
| EP | 0862794 B1 | 9/1998 |
| EP | 1017112 A2 | 7/2000 |
| EP | 0936682 B1 | 8/2000 |
| EP | 1221724 A2 | 7/2002 |
| WO | WO 97/50132 | 12/1997 |
| WO | WO 98/05078 | 2/1998 |
| WO | WO 98/12757 | 3/1998 |

* cited by examiner

ILLUMINATION DEVICES COMPRISING WHITE LIGHT EMITTING DIODES AND DIODE ARRAYS AND METHOD AND APPARATUS FOR MAKING THEM

FIELD OF THE INVENTION

This invention relates to the illumination devices comprising white light emitting diodes ("white LEDs").

BACKGROUND OF THE INVENTION

White LEDs are important in a wide variety of direct and indirect illumination applications. A white LED typically comprises a blue or ultraviolet LED whose emitted light is passed through a phosphor that converts the emitted light to white light. Such LEDs individually or in arrays can be used for room and space illumination, vehicle headlights, signs, and indicators. The emission spectra and color temperature of white LEDs is closer to sunlight than many forms of conventional lighting.

Unfortunately, it is difficult to efficiently make white LEDs enough to compete with conventional light sources. One source of inefficiency is coating the LED with the optimal thickness of phosphor. There should be sufficient phosphor to convert the emitted light but not so much as to block or absorb the white light output. Further details concerning the structure and operation of white LEDs may be found, for example, in U.S. Pat. Nos. 6,576,930; 6,608,332 and 6,614,179 which are incorporated herein by reference.

One approach to coating is to dispose the LEDs on a substrate, to dispense a thick transparent resin layer over the LEDs, and to apply over the transparent layer, a thin layer of resin containing phosphor particles. Ideally the resins dry to form a lens and an outer uniform phosphor layer around the diode. See, for example, U.S. Pat. No. 5,959,316.

There are, however, two problems with this approach. First, the uniformity of the phosphor coating is dependent on the shape of the transparent layer which, in turn, is difficult to control, especially when the resin is dispensed and dried over a wire bonded array. Second, the presence of the intervening transparent layer separates the LED from the phosphor, causing an undesirable broadening of the effective optical area.

In an attempt to overcome some of these problems, efforts were made to electrophoretically coat the LED with a uniform coating of phosphor. See U.S. Pat. No. 6,576,488. However this approach requires selectively masking some portions of the LED structure with conductive material (where phosphor is to be deposited) and other portions with dielectric material. The multiple masking and coating steps add substantially to the time and cost of fabrication.

Accordingly there remains a need for improved white LEDs and LED arrays and for an improved method of fabricating them.

SUMMARY OF THE INVENTION

In accordance with the invention, an illumination device comprises a substrate having a surface and a cavity in the surface. At least one light emitting diode ("LED") is mounted within the cavity, and a monolayer comprising phosphor particles overlies the LED. The phosphor monolayer is adhered to the LED by a monolayer of transparent adhesive material. An optical thick layer of transparent material overlies the phosphor monolayer to encapsulate the LED and optionally to form a lens.

The white LED or LED array can advantageously be fabricated by providing a substrate including one or more LEDs, applying a thin layer of tacky adhesive over the LEDs and applying a thin layer comprising particles of phosphor over the adhesive. The particles adhere to the tacky adhesive in a substantially uniform layer of self-limiting thickness. They selectively adhere where the tacky material is exposed. Advantageously, the thickness of adhesive and particle size are chosen to provide monolayers of desired thickness. Advantageous apparatus for practicing this method is described.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

Figure 1:
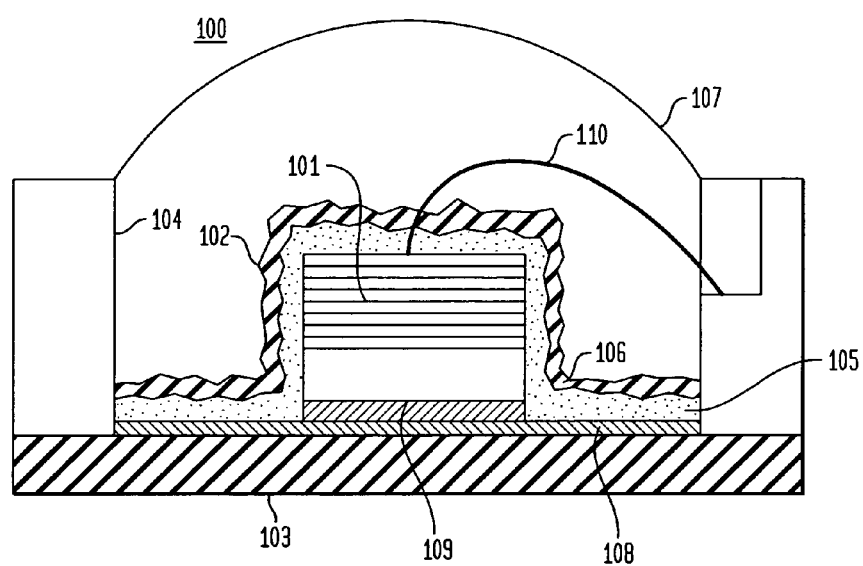
FIG. 1 is a schematic cross sectional view of a typical single LED packaged in accordance with the invention.

Referring to the drawings, FIG. 1 is a schematic cross section of an exemplary white light emitting diode ("white LED") package assembly 100 for creating white light using a LED 101 and a fluorescent converting phosphor particle layer 102. The LED die 101 is placed on and advantageously wirebonded to the surface of a thermally conductive substrate 103 (preferably ceramic) inside a cavity 104. An optical adhesive monolayer 105 is placed on top of the LED body 101 and phosphor particles 106 forming layer 102 are adhered on top of the body. Also shown is an optional encapsulation dome lens 107 encapsulating the coated LED within the cavity 104. The package assembly 100 is composed of substrate 103, a highly reflective layer 108, usually silver, overlying the substrate and a conductive die attach material 109. LED body 102 is typically a nitride LED emitting blue or UV light, and can be connected using a wirebond 110. LED body 101 can have both P and N terminals on the top surface of the LED, in which case two wirebonds 110 will be attached from the top; or it can have both terminals on the bottom surface, using solder-bumping for attachment.

In fabricating the assembly 100, LED body 101 is advantageously covered with a first sticky transparent material 105. The transparent material 105 can be covered with a single layer 102 comprising phosphor particles 106. Once deposited, the particles 106 can create a closed packed structured layer 102 film on top of sticky optical material 105. Ceramic cavity 104 can optionally then be sealed with a second transparent material 107 that advantageously forms a dome or lens in order to minimize total internal reflection ("TIR").

Figure 2:
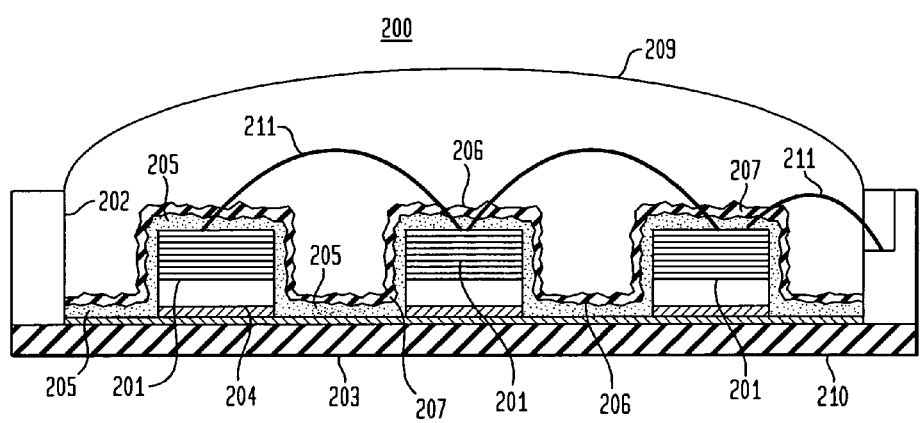
FIG. 2 is a schematic cross sectional view of a typical array of LEDs packaged in accordance with the invention.

FIG. 2 illustrates a multiple LED array assembly 200 in which several LEDs 201, are placed inside a ceramic cavity 202 similar to the cavity 104 described above. Advantageously, multiple LEDs 201 can be attached on top of a highly conductive substrate 203, as by conductive epoxy 204. A transparent adhesive monolayer 205 is placed on top of the multiple LED bodies 201 and a layer 206 of phosphor particles 207 is adhered overlying and over the sides of the bodies 201. In fabrication, all LEDs 201 can simultaneously be coated with the first tacky transparent material 205. The particles 207 of the phosphor layer coating can attach to the tacky layer 205 creating a closed packed dense film layer 206. Then assembly 200 comprising wirebonded LEDs 201 can then optionally be sealed as by covering with a second transparent material 209 that can optionally create a dome or lens. The lens minimizes TIR.

Substrate 203 can be metal, ceramic, multilayer printed wire board, LTCC, HTCC or other suitable thermal conductor. The substrate advantageously includes a heat sink. It can be electrically insulating or electrically conducting. Substrate 203 advantageously comprises a highly thermally conductive metal such as copper, tungsten or molybdenum and/or a highly thermally conductive ceramic such as aluminum nitride (ALN), silicon carbide (SiC) or aluminum oxide ($Al_2O_3$). In a preferred embodiment it can be nickel-plated copper molybdenum copper clad. Metal powder mixtures such as molybdenum copper, can be used in order to match the thermal expansion coefficient of the LED dies.

It is advantageous to coat and encapsulate in panel form. A panel will contain multiple cavities 202, each with one or more LED assemblies. The panel is subsequently diced into individual elements 200. As an example, a panel can contain up to 24 elements (15.24 $cm^2$), an element (1.25 $cm^2$) can contain 7 cavities and a cavity can hold up to 12 (300 micron) LEDs.

Reflective surface layer 210 can be a coating of metal, such as silver, in a thick or thin film layer overlying the substrate 203. LED dies 201 can be attached to the package by conductive epoxy 204, non-conductive epoxy or solder.

Most of the heat generated by the LED during operation can be carried away from the diode through the substrate. Accordingly, it is desirable for the connection between the LED and the substrate to have high thermal conductivity. Some LEDs are fabricated with both electrodes (anode P and cathode N) on the top surface. In such cases electrical connections can be made from the LED 201 to contacts on the substrate using wire bonds 211. The wire bonds 211 can be ball-wedge and wedge-wedge bonded gold or aluminum wires. Wires 211 can have different thicknesses. Other fabrications can have one electrode on the top face of the LEDs 201 and the second electrode on the bottom. In this case, the connection between the LED 201 and the substrate 203 serves three purposes, first to mechanically attach the LED die to the substrate, second to provide a thermal path from the die into the substrate 203, and third as an electrical connection to one of the LED electrodes.

The tacky transparent material 205 advantageously is a resin that has an index of refraction (IR) between the LED semiconductor material (3.0–2.8) and the fluorescent material particles 207 (1.77). The tackiness of the material is due to a b-stage or partially cured resin. Tackiness is needed to adhere particles 207. The material 205 will also serve as a buffer layer as the photons exit the LED junctions and couple with the frequency converting phosphor 207. The converting phosphor can be particles of YAG:Ce. This structure will maximize the extraction of photons from LEDs 201 and produce a uniform color light distribution.

The preferred tacky transparent materials include but are not limited to partially cured silicones. The silicones can include micro amino emulsions, elastomers, resins and cat-ionics. Other useful polymeric resins include butyrals, cellulosic, silicone polymers, acrylate compounds, high molecular weight polyethers, acrylic polymers, co-polymers, and multi-polymers. The index of refraction of the above-mentioned materials can be tailored for optical matching.

Embodiments 100 and 200 depict frequency converting particles deposited on the sides and on top of the LED body. The particles are advantageously single crystal from 5 to 19 micrometers in size preferably in a D:50 particle size distribution. Examples of such phosphor materials suitable for frequency conversion include but are not limited to garnet fluorescent material activated with cerium which can contain Y, Lu, Sc, La, Gd or Sm and an element from Al, Ga and In. Examples of non-garnet materials include $Sr_2SiO_4$ doped with Eu. There are also organic semi-conducting phosphors for the near UV (360–410) and blue (>410 nm) useable as wavelength converters. These new organic materials can be pulverized into particles and deposited using the techniques disclosed herein.

The optional transparent encapsulant of assemblies 100, 200 can serve two purposes. The material can seal or encapsulate the cavity containing the coated LEDs, and it can create a lens that minimizes TIR. The index of refraction of the second material preferably lies between the fluorescent material particles (1.77) and air (1.0). The dome shaping of the lens is due to the thixotropic properties of the material. This material is conveniently applied using a manifold syringe on automated equipment. It can alternatively be injection molded as by a steel mold. Useful materials include butyrals, cellulosic polymers, silicone polymers, acrylate polymers, high molecular weight polyethers, and acrylic polymers, co-polymers, and multi-polymers. These materials can be tailored to have optically matched indices of refraction and appropriate viscosities.

Preferably the illumination device is composed of at least one LED, at least one monolayer of transparent tacky material and at least one monolayer comprising frequency converting inorganic particles. The term "monolayer" as used herein refers to a thin film or coating that is less than 25 microns thick. Other layers that can be added include an amorphous film (no definite crystal structure) that conforms or molds to its surroundings. The surface of the LED crystal can be modified by deposition of a monolayer, which may change the reactivity of the LED surface with respect to particles. A surfactant can be used. Surfactants (or surface active agents) are special organic molecules which are made up of two sections: the hydrophilic part (usually ionic or nonionic) which likes water and the hydrophobic part (usually a hydrocarbon chain) which likes oil. The interfacial layer formed as a result of this is usually a monolayer and allows the particles to adhere to the LED. These monolayers can play an important role in the adhesion process.

The monolayer of frequency converting particles can be a layer of particles or an organic film layer that includes the particles. The adhesion mechanism that holds the particle layer can involve many mechanisms of particle-to-particle bonding. Among them are mechanical interlocking, molecular forces, Vanderwaals adhesion forces, capillary, electrostatic, magnetic, and free chemical forces. In most cases, the strength of the particle-to-particle particle bond depends on the contact pressure and surface area of contact between particles. The key is to create a dust or mist comprising the particles over the tacky film.

The control of the powder quality such as the particle size distribution, shape, and composition of the constituents has major influence on the development of the particle monolayer. Increasing the packing density in powders is usually accomplished by filling the interstices between large particles with smaller particle sizes. In order to increase the packing density of particles adhered to the tacky monolayer, the preferred particle distribution of the powder, measured by a coulter counter with a 50 micron aperture, is:

| Volume % | Size |
|---|---|
| 5 | 4.0 micron |
| 25 | 8.3 micron |
| 50 | 11.6 micron |
| 75 | 14.8 micron |
| 95 | 19.4 micron |

Figure 3:
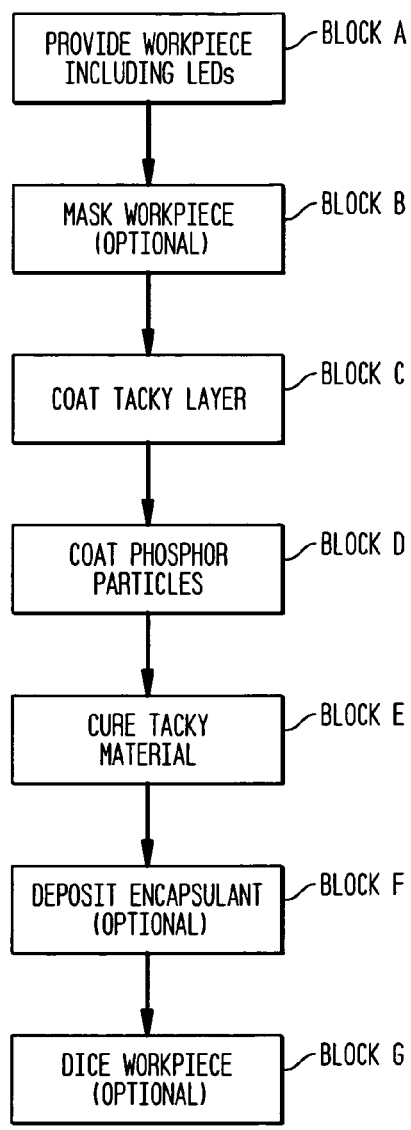
FIG. 3 is a flow chart showing the steps in fabricating a white LED or LED array in accordance with the invention.

FIG. 3 is a flow diagram showing the steps involved in an advantageous method of fabricating the white LEDs illumination devices. The first step, shown in Block A, is to provide a workpiece including one or more LEDs. A single LED is advantageously mounted in a cavity on a substrate and electrically connected as shown in FIG. 1. An array of LEDs is advantageously mounted and connected in a cavity on a panel as shown in FIG. 2.

The next step, which is optional in some applications, is to mask the workpiece to cover areas of the workpiece which do not need to be coated with phosphor particles. The mask can be a reusable mechanical mask e.g. stainless, beryllium copper or a non-reusable mask such as plastic or paper. The mask will not be needed if the first optical material is selectively deposited such as by an automated dispensing machine using a syringe or pipette. The mask is also not needed if areas of the first transparent material are selectively made sticky, as, for example, by selectively exposing coated areas to a UV curing lamp.

The third step, shown in Block C, is to coat a transparent layer of tacky material over the LED(s). In order to create a monolayer of 5 to 25 microns in thickness, it is preferred to spin coat or spin remove the material using high rpm semiconductor spinning equipment. Panel wafers with mounted LEDs can be placed in the vertical position in order to maximize the removal of excess tacky material.

The next step (Block D) is coating the fluorescent phosphor particles on the tacky first transparent material. A monolayer can be deposited by spraying the particles at high velocity onto workpiece wafers. The surface of the tacky material will adhere only one to a few of the particles in depth, creating a monolayer which is not sticky. As a result, the particle coating is self-limiting. The particles will coat in all directions including the walls of the LED body as well as multiple contours.

The next step (Block E) is to cure the tacky material to cross-link the polymers. Curing can be done by heat curing, e.g. UV curing or microwave curing, or by other curing methods.

The 5$^{th}$ step (Block F), which is optional, is to deposit the second transparent layer of encapsulating material overlying the coated LEDs inside the cavity or cavities. The second encapsulating as noted above, forms a protective seal and optionally, forms a lens.

The next step shown in Block G, is to optionally dice the workpiece into a plurality of white LEDs or white LED arrays. A panel of coated and encapsulated LEDs can be diced into individual pieces using a dicing saw or a water jet.

Figure 4:
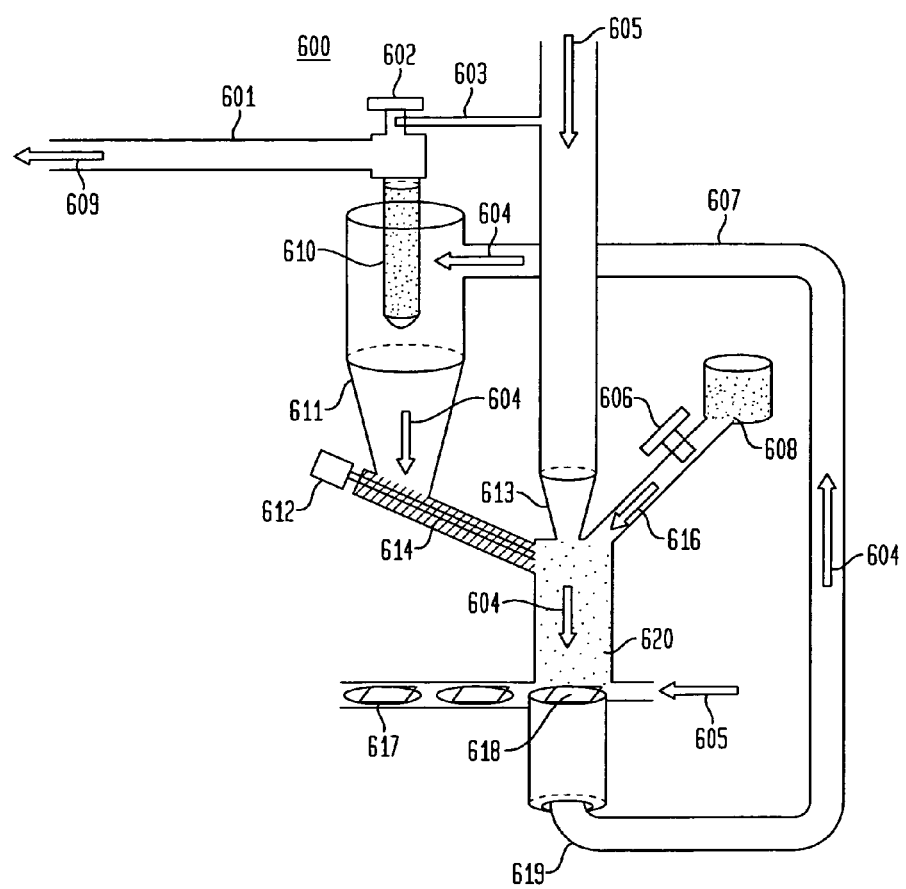
FIG. 4 is a schematic representation of a coating apparatus to facilitate coating the LEDs with phosphor particles.

FIG. 4 schematically illustrates coating apparatus 600 to facilitate coating white LED workpieces 618 with phosphor particles 620. In essence, the apparatus comprises an enclosed particle coating chamber 604 for receiving workpieces 618 to be coated. Chamber 604 is coupled to a reservoir 608 of particles to be coated, a source of pressurized gas 605 through a Venturi Nozzle 613 and a recycling chamber 611. It includes enclosed openings for coated wafers 618 to exit and unused particles to pass to the recycling chamber 611. Air flow 605 from an outside source, such as a blower or high pressure air compressor, is inserted into apparatus 600. The air pressure can be approximately 100 PSI on an intake hose or tube. The air compresses into a nozzle 613 where the Venturi effect and the difference in pressures, forces the particles to the air stream from reservoir 608. The force of the air flow is advantageously large enough to break any agglomerates in the phosphor powder, thus fluidizing the particles and dispersing them at high velocity. An air velocity of 10 to 15 feet per second is sufficient for this purpose. Mechanical dispersal of particles precludes the need for chemical dispersants for the phosphor particles. This is particularly advantageous since introduction of these additives can induce unwanted color nuances.

As the particles become fluidized, the coating process begins in the coating chamber 604 and deposits particles 620 randomly on top of the wafer 618. The incoming panel feed transports wafers 617 into coating chamber 604. Wafer 618 is shown in position to be coated. Excess particles 620, not deposited into the wafer, move to the bottom of the chamber 619 and can be re-circulated by flow 604 into the system by back feed tube 607. Back air pressure 609 can be created by vacuum source 601. Flow 609, created by suction caused by vacuum source 601, passes through a powder filter 610. Filter 610 can be paper or preferably sintered metal powder, which gets purged by a purging valve 602, that is bridged from the incoming air stream 603. The recycled particles can then drop by gravity into the bottom of the cyclone chamber 611 and into a screw feed 614. Screw feed 614 can be controlled by stepping motor 612. The screw feed can then move the phosphor particles back into the nozzle 613 by the Venturi effect and the cycle repeats again.

The present invention can now be better understood by the following non-limiting examples of material combinations.

EXAMPLE 1

Substrate Material: Copper Molybdenum Copper (Sumitomo Inc.)LED: UltraBrightTM InGaN LED (Cree Inc.) First Optical Material: NYOGEL OKT-0451 2 part silicone heat curable (NYE optical)Frequency Converting Material: YAG:Ce Phosphor (Phosphor Technologies UK)Second Optical Material: LED Encapsulant 9616 Dymax Corp

EXAMPLE 2

Substrate Material: Copper Tungsten (Marketech Int. INC) LED: InGaN/GaN Blue LED's 3.3 (Epistar Corporation)First Optical Material: Sylguard—2 part silicone heat curable (Dow Corning INC)Frequency Converting Material: YAG:Gd Phosphor (Phosphor Tech. USA)Second Optical Material: LS-6257 Encapsulant (Light Span Corp)

The advantages of the inventive illumination devices and method are manyfold. An array of LEDs plus a mono-layer of fluorescent material can be used to create a light source having a uniform white light distribution, thus minimizing the "Halo Effect". Without wishing to be bound by theory, it is believed that the "Halo Effect" or bleed-through effect occurs because the light from the blue LED is directional while the yellow/amber from the phosphor radiates over $2\pi$ solid angle. Thus, an observer looking at a prior art LED from the side, can see a color that appears multi-color, not white. The single layer of fluorescent material as per the inventive technique, can coat multiple blue LEDs and create a uniform white light distribution in all directions.

Photonic emission recombination of wavelengths, usually from 360 nm to 530 nm, can be accomplished by an interaction between the host and the activator. The recombination can be attributed to the presence of an excited outer shell of the phosphor dopant ion. The emission band of the phosphor particles single crystal structure shifts of to a longer wavelength as the photon crosses the fluorescent material. The invention creates an efficient blue LED plus phosphor white light by minimizing the number of times that the photons have to pass through the wavelength converting material.

The blue LED approach is not limited to only one wavelength converting phosphor. It can be used with a two or three component phosphor system to generate high quality white. This option may use an ultra violet ("UV") LED to excite several phosphors to simultaneously generate different colors. Multiple phosphors are preferred in order to increase the Color Rendering Index ("CRI") of the light. Using such techniques, high color rendering indices similar to fluorescent lamps can be realized. The present invention can create a homogenous mix of the multiple phosphors by mechanically mixing phosphors at high speeds.

Scattering losses can be attributed to encounters with a particle or molecule as the electromagnetic wave propagates. The net effect is that the incident wave becomes partially re-radiated in different directions and hence loses intensity in its original direction of propagation. In order to minimize scattering loss, a single layer of fluorescent material in the form of a thin film layer of particles is preferred. Contrary to previous methods, the phosphor particles are not mixed in binders or epoxies. No matter how thin the layer is deposited, multiple particles in a binder will contribute to an increase in scattering losses. The applicant discloses a method in which a self limiting single layer of particles is attached to an optical dielectric film.

Optically matched dielectric material is critical for the reduction of total internal reflection (TIR). Snell's Law relates the angles incidence and refraction angle $\theta$ to the refractive indices of the material (n), where the critical angle is given by $\sin \theta_c = n_2/n_1$, where $n_1$ is the index of refraction of the LED, and $n_2$ is the index of refraction of the coating. In order to minimize TIR, the preferred embodiment will coat the LED diode body with material having refractive indices that allow for maximum ray extraction from the semiconductor materials. At the same time the dielectric coating will allow particles of fluorescent material to attach to its surface creating a uniform conformal layer around its body.

In order to create the aforementioned coatings, a coating apparatus and manufacturing method had to be developed. The coating method includes a thin film layer of optically matched tacky material that is deposited prior to a uniform particles coating. The whole process occurs with the LED diodes already mounted and wirebonded to the thermal package inside the cavity.

It is to be understood that the above-described embodiments are illustrative of only a few of the many possible specific embodiments which can represent applications of the principles of the invention. Numerous and varied other arrangements can be readily devised by those skilled in the art without departing from the spirit and scope of the invention.

What is claimed is:

1. An illumination device comprising:
   a substrate having a surface and a cavity in the surface;
   at least one light emitting diode (LED) mounted within the cavity;
   a phosphor monolayer comprising phosphor particles overlying the LED, the phosphor particles for converting the emitted light into white light, the phosphor monolayer adhered to the LED by a monolayer of adhesive material.

2. The illumination device of claim 1 further comprising a thick layer of transparent material encapsulating the LED.

3. The illumination device of claim 1 wherein the substrate comprises a heat sink and the LED is thermally coupled to the heat sink.

4. The illumination device of claim 1 wherein the LED is a blue or ultraviolet LED.

5. The illumination device of claim 1 wherein the phosphor monolayer is a monolayer of phosphor particles.

6. The illumination device of claim 1 wherein the phosphor comprises a YAG:Ce phosphor.

7. A method for making an illumination device comprising one or more white light LEDs comprising the steps of:
   providing a workpiece comprising a substrate having a surface including one or more cavities that contain one or more LEDs connected to electrical leads;
   forming a coating of tacky adhesive material overlying at least one of the LEDs;
   exposing the coating of tacky material to particles comprising phosphor material to form a self-limiting coating of particles overlying the at least one LED; and
   curing the tacky adhesive material.

8. The method of claim 7 further comprising the steps of applying an optical material in the cavity to encapsulate the coated LED.

9. The method of claim 7 wherein the substrate comprises a heat sink and the LED is thermally coupled to the heat sink.

10. The method of claim 7 wherein at least one of the LEDs is a blue or ultraviolet LED.

11. The method of claim 7 wherein the coating of tacky adhesive material comprises a monolayer of tacky adhesive material.

12. The method of claim 7 wherein the coating of particles comprises a monolayer of particles.

13. The method of claim 7 wherein the tacky adhesive material is cured by heating.

14. The method of claim 8 wherein the optical material applied to encapsulate the LED is applied by syringe injection or by injection molding.

15. The method of claim 7 further comprising the step of dicing the workpiece into a plurality of white light LED devices.

16. The method of claim 7 further comprising the step of masking portions of the workpiece prior to coating with tacky adhesive.

17. Apparatus for coating phosphor particles on adhesive-coated LED workpieces comprising:
   an enclosed particle coating chamber for receiving the workpieces,
   a reservoir of phosphor particles to be coated, coupled to the chamber;
   a source of pressurized gas coupled to the chamber through a Venturi Nozzle; and a recycling chamber for receiving and recycling unused particles coupled to the chamber.

18. An illumination device comprising:
a substrate having a cavity;
at least one light emitting diode (LED) mounted within the cavity;
a self-limiting layer comprising phosphor particles adhered to the LED by a layer of adhesive material.

19. The illumination device according to claim 18 further comprising an encapsulant overlying the layer comprising phosphor particles.

20. The illumination device according to claim 18, wherein the substrate comprises a heat sink and the at least one LED is thermally coupled to the heat sink.

21. The illumination device according to claim 18, wherein the at least one LED comprises a blue LED.

22. The illumination device according to claim 18, wherein the at least one LED comprises an ultraviolet LED.

23. The illumination device according to claim 18, wherein the phosphor particles comprise YAG:Ce.

24. The illumination device according to claim 18, wherein the adhesive material is silicone.

25. The illumination device according to claim 18, wherein the adhesive material has an index of refraction between about 1.7 and about 3.0.

26. The illumination device of claim 1, wherein the adhesive material comprises silicone.

27. The method of claim 7, wherein the tacky adhesive material comprises partially cured silicone.

28. The method of claim 7, wherein the tacky adhesive material has an index of refraction between about 1.7 and about 3.0.

* * * * *